US006955925B1

(12) United States Patent
Donohue et al.

(10) Patent No.: US 6,955,925 B1
(45) Date of Patent: Oct. 18, 2005

(54) ANNEALING

(75) Inventors: Paul P Donohue, Worcesteshire (GB); Michael A. Todd, Worcesteshire (GB)

(73) Assignee: QinetiQ Limited, London (GB)

( * ) Notice: Subject to any disclaimer, the term of this patent is extended or adjusted under 35 U.S.C. 154(b) by 0 days.

(21) Appl. No.: 09/914,920

(22) PCT Filed: Mar. 3, 2000

(86) PCT No.: PCT/GB00/00753

§ 371 (c)(1),
(2), (4) Date: Oct. 30, 2001

(87) PCT Pub. No.: WO00/54317

PCT Pub. Date: Sep. 14, 2000

(30) Foreign Application Priority Data

Mar. 6, 1999 (GB) ................................. 9905098

(51) Int. Cl.⁷ .................... H01L 21/00; H01L 29/76; C23C 16/00
(52) U.S. Cl. ................. 438/3; 438/22; 438/239; 438/240; 438/660; 438/212; 438/689; 257/303; 257/310; 257/296; 257/295; 257/315; 118/715; 118/719; 118/716; 118/724
(58) Field of Search ................ 438/3, 22, 239–240, 438/660, 212, 689; 257/303, 310, 296, 295, 257/315; 118/715–724, 638, 640

(56) References Cited

U.S. PATENT DOCUMENTS

| 4,437,139 A | * | 3/1984 | Howard .................... 361/313 |
| 4,456,490 A | | 6/1984 | Dutta et al. |
| 4,645,547 A | * | 2/1987 | Krause et al. ............ 148/111 |
| 4,701,592 A | * | 10/1987 | Cheung .................. 219/121.77 |
| 5,219,786 A | | 6/1993 | Noguchi |
| 5,309,456 A | * | 5/1994 | Horton ...................... 372/25 |
| 5,310,990 A | | 5/1994 | Russell et al |
| 5,337,333 A | * | 8/1994 | Daly et al. .................. 372/94 |
| 5,372,859 A | * | 12/1994 | Thakoor .................. 427/551 |

(Continued)

FOREIGN PATENT DOCUMENTS

EP   0 114 228   8/1984

(Continued)

OTHER PUBLICATIONS

Martinez et al, "Magnified Expansion and Compression of Subpicosecond Pulses from a Frequency-Doubled ND:YLF Laser", IEEE Journal of Quantum Electronics 25(10):2124-2128 (1989).

(Continued)

Primary Examiner—B. William Baumeister
Assistant Examiner—Igwe U. Anya
(74) Attorney, Agent, or Firm—Nixon & Vanderhye P.C.

(57) ABSTRACT

A method and apparatus for annealing an integrated ferroelectric device (10) is disclosed in which the device (10) comprises a first layer of material capable of existing in a ferroelectric state and a second layer of material defining an integrated circuit below the first layer such as a microbridge thermal detector. The method comprises producing a pulse of energy, extending the pulse temporally using a pulse extender (200) and illuminating the first layer with the extended pulse. The duration and wavelength and fluence of the extended pulse are selected so that the material of the first layer is annealed into a ferroelectric state without exceeding the temperature budget of the integrated circuit. Application of the method in heating other articles which comprise a layer to be heated and a temperature sensitive layer is also disclosed. By extending the temporal width of the pulse, energy is supplied at a rate which ensures a more even heating of the first layer without damaging the temperature sensitive layer over time.

23 Claims, 6 Drawing Sheets

U.S. PATENT DOCUMENTS 5,602,677 A * 2/1997 Tournois ..................... 359/566
5,626,670 A    5/1997 Varshney et al
6,137,553 A * 10/2000 Izumi et al. .................. 349/49
6,215,099 B1 * 4/2001 Livshits ................ 219/121.76

FOREIGN PATENT DOCUMENTS

EP    0 199 388    10/1986
WO    WO 9717164 A1 *  5/1997  .......... B23K 26/06

OTHER PUBLICATIONS

Matsui et al, "Laser annealing to produce ferroelectric-phase PbTiO/sub 3/thin films", Journal of Applied Physics 52(8): 5107-5111 (1981).

* cited by examiner

ANNEALING

This application is the US national phase of international application PCT/GB00/00753, filed in English on 3 Mar. 2000, which designated the US. PCT/GB00/00753 claims priority to GB Application No. 9905098.1 filed 6 Mar. 1999. The entire contents of these applications are incorporated herein by reference.

This invention relates to improvements in annealing, and in particular to a method and apparatus for annealing ferroelectric thin film materials.

There has been a considerable amount of research into the development of devices which utilise the thermal properties of ferroelectric materials. One example is the development of infrared imaging cameras based on two-dimensional arrays of ferroelectric thermal detectors which are attractive due to their near ambient temperature operation. Thermal detectors used for infra-red imaging rely on the temperature change of the sensing material due to absorption of infra-red radiation. With ferroelectric materials this radiation causes a change in the electrical polarisation of the material which enables the magnitude of the change in temperature to be detected.

In order to reduce the size of the detectors, combined integrated ferroelectric devices have been developed in which the ferroelectric material is combined with the electronic read out circuitry in a single device. Typically, these devices comprise layered structures with a thin layer of ferroelectric sputtered or spin coated or otherwise deposited onto or above one or more base layers. Other examples of such integrated ferroelectric devices are thin film piezoelectric actuators and ferroelectric random access memories (FeRAM).

The combination of the ferroelectric material with the active circuitry in one package produces a more compact device than the provision of a separate read out circuit and improves yield, reduces cost and improves performance. However, a fundamental problem with such devices is the need to deposit the ferroelectric material within a thermal budget that is compatible with the integrated circuitry not being damaged or destroyed by elevated temperatures. It is widely recognised that exposure of an integrated circuit to temperatures above 450° C. is a constraint on the processing of chips/materials with IC content, and this conflicts with the growth requirements of many ferroelectric layers.

A particularly important family of ferroelectric materials in use and under investigation for IR detector, actuator or FeRAM applications is the perovskites. This family include materials such as lead scandium tantalate (PST), lead zirconate titanate (PZT), barium strontium titanate (BST), lead titanate (PT) and others. For use as a ferroelectric the material layer must be in the perovskite phase. It can either be deposited directly into that phase at an elevated temperature or at a lower temperature which is then subsequently annealed into the ferroelectric perovskite phase. Layers deposited at low temperatures are generally in an amorphous, pyrochlore or other phase which is incapable of exhibiting ferroelectricity. For PST, for example, the material must be deposited at temperatures in excess of 450° C. to enter the perovskite phase. Direct depositing of these materials in a perovskite phase is therefore incompatible with the temperature budgets of integrated circuitry.

One known way of providing a layer of ferroelectric material in the perovskite phase without damaging an ROIC provided on a base layer is to deposit the material in a non-ferroelectric state at a low temperature (say less than 450° C.). The material may then be annealed using a laser to heat the layer sufficiently to convert the material into its perovskite phase.

In order to understand the effect of laser annealing, consider the structure of a typical uncooled microbridge type IR detector. From the top surface downwards prior to the electrode deposition, the layers of material are as given in Table 1.

TABLE 1

| Material | Thickness | Purpose |
|---|---|---|
| PST | 1 μm | Ferroelectric |
| Pt | 1000Å | Bottom electrode |
| Ti | 50Å | Adhesion layer |
| SiO2 | 1000Å | Barrier layer |
| Sac | 1–2.5 μm | Sacrificial layer |
| SiO2 | 0.8 μm | Passivation/barrier layer |
| ROIC |  | Active circuitry |
| Si | 500 μm | Substrate wafer |

In order to heat the PST layer sufficiently without damaging the ROIC (Read Out Integrated Circuitry) layer, the laser wavelength must be chosen so that strong absorption occurs in the PST layer. The temporal width of the pulse must also be kept sufficiently short that the heat diffusion length is small enough to prevent the induced heat wave from penetrating through the layers to the ROIC layer. For relatively thin layers up to, say, 1000 μm these criteria are satisfied by commercially available excimer lasers. These lasers operate in the ultraviolet (UV) and have short pulse lengths of around 25 ns. Pulses are delivered to the layer as either a single shot or at a slow repetition rate of 100's of Hz or thereabouts. The measured reflectivity of low temperature deposited (non-perovskite) PST at the wavelength of a typical commercial excimer laser of 248 nm is 21%. This indicates strong absorption, whilst the absorption length at this wavelength, calculated from experimental data, is 19 nm indicating strong surface absorption.

To generate sufficient temperature at the bottom of a thick layer of PST (greater than 1000 Å) requires relatively high energy density excimer lasers. Increasing the power increases the surface temperature. This places a limit on the maximum possible thickness of PST which can be annealed at around 1000 Å due to extreme surface heating which can cause surface damage, poor crystallisation and crystal quality, poor film physical integrity and loss of stoichiometry due to evaporation of volatile components. As a result, the use of such a laser is unsatisfactory for layers above, say 2000 Å (and more so for even thicker layers), with extremely high temperatures being generated at the surface of the layer and high thermal gradients being generated in the PST due to the short absorption and diffusion lengths resulting from the short pulse duration.

An object of the present invention is to overcome or alleviate the problems involved in the laser annealing of relatively thick layers of ferroelectric materials posed by the constraints of commercially available lasers.

In accordance with a first aspect, the invention provides a method of producing an integrated ferroelectric device comprising a first layer of material capable of existing in a ferroelectric state and a second layer of material defining an integrated circuit, the method comprising the steps of:

producing a pulse of energy having a first temporal width;

extending the temporal width of said pulse by passing it through a temporal extender to produce a processed pulse having a greater temporal width; and illuminating the first layer with said processed pulse to convert some or all of the material in the first layer from a non-ferroelectric state into a phase capable of exhibiting ferroelectricity or otherwise improving the quality of the material of the first layer without exceeding the temperature budget of the integrated circuit of said second layer.

The method may further comprise generating a number of such processed pulses and sequentially illuminating the device with said pulses.

Preferably, the material of the first layer comprises a low grade deposited perovskite and the method improves the quality (i.e. greater crystal order and/or crystal size) of the perovskite material. Alternatively, the material may be deposited substantially in a non-perovskite phase and the method converts some or all of the material into the perovskite phase.

Preferably, the pulse of energy comprises a pulse of energy produced using a laser. More than one such pulse may be produced, with each pulse being temporally extended. The first layer may be sequentially illuminated by a number of such processed pulses.

By providing a temporal extender, it is possible to deliver the laser energy to the first layer at a slower rate than is possible with a non-extended laser pulse using commercially available laser sources. This increases the diffusion length in the material ensuring more even heating throughout the layer and reduced surface temperatures at the face of the first layer nearest the laser source.

The laser pulse may be produced using an excimer laser. It may have a wavelength in the ultraviolet of around 248 nm (for a KrF excimer laser). Alternatively, the pulse may be produced using a $CO_2$ laser.

The pulse produced by the laser may have a temporal length of substantially 10 ns, or 20 ns or perhaps substantially 25 ns, or even beyond or any value within a range of values limited by one or more of the preceding values. This represents the limit for current commercially available excimer lasers.

The temporal extender may increase the temporal length of the pulse to produce a processed pulse with a temporal length of approximately 300 ns, or between substantially 300 ns and 400 ns, or perhaps longer. For instance, the processed pulse may have a temporal length that is an order of magnitude greater than the unprocessed pulse.

The extended pulse may comprise more than one sub-pulse, each sub-pulse corresponding to a pulse action of the extender. These may be separated by a known time interval to produce a sequence of closely spaced sub-pulses defining the processed pulse. The temporal width of each subpulse may correspond to the temporal width of the unprocessed pulse. They may be separated by, say, substantially 25 ns or substantially 30 ns or substantially 50 ns or less or more or any range bounded by one of the values. In the case of ten sub pulses, an processed pulse with a temporal width of about 400 ns is produced.

The processed pulse may, therefore, comprise two, three, four, or perhaps ten or more sub-pulses which are temporally spaced close together to form a processed pulse. By close we mean that the spacing between sub-pulses may be less than the width of each sub-pulse or perhaps equal to the sub-pulse width, or larger than the sub pulse width.

Each sub-pulse may be produced by partial reflection of the unprocessed pulse within the temporal extender.

The method may comprise producing a processed pulse having a fluence and temporal width that is compatible with the properties of the material of the first layer such that the temperature throughout the layer (or over a substantial depth of the first layer) exceeds a predetermined anneal temperature whilst the temperature of the second layer is within the temperature budget of the circuitry.

In one especially useful embodiment, the processed pulse properties (including fluence, temporal width and wavelength) may be selected so that the whole of the first layer exceeds the transition temperature for placing the material into a ferroelectric perovskite phase. This may be greater than 450° C. At the same time, the peak temperature in the second layer may be kept lower than 450° C.

The first layer may comprise a layer of PST (or other material) of thickness of substantially 0.1 $\mu$m, or perhaps substantially 1 $\mu$m, or perhaps substantially 0.8 $\mu$m or substantially 1.2 $\mu$m or any value therebetween.

The first layer may comprise the top layer of the device. Alternatively, it may have other layers provided both above and below it defining a sandwich like structure. The integrated circuitry may be provided below the first layer.

In a refinement of the method, at least one additional layer may be provided above the first layer (i.e. on the opposite side to the second layer).

Two different sources of energy may be used, each source producing a respective pulse and each respective pulse being extended by a pulse extender to produce a processed pulse. The first layer may then be illuminated by both processed pulses. This may be either substantially simultaneously or sequentially.

The different sources of energy may comprise two different lasers, each generating a pulse of a different wavelength. For instance, one source may comprise a KrF laser or other type of excimer laser, whilst the other source comprises a carbon dioxide ($CO_2$) laser.

In one arrangement, the method may include providing a metallic layer between the first layer and the second layer and illuminating the first layer with two different processed pulses. A $CO_2$ laser and a KrF laser may be used whereby two effects arise. Firstly, the first layer is heated from the top down by the KrF laser pulse. Secondly, the first layer is heated up from the bottom upwards due to heating of the metallic layer when excited by the $CO_2$ laser pulse. This effectively heats the layer from both sides.

The fluence of the pulse may be substantially be 0.05 $J/cm^2$, 0.1 $J/cm^2$, 0.2 $J/cm^2$ or perhaps a higher value or a lower value. It may be selected to be any value within a range bounded at its upper limit and/or lower limit by one or more of these values. For example, it may be in the range 0.05–0.1 $J/cm^2$ or 0.1–0.2 $J/cm^2$ or 0.05–0.1 $J/cm^2$.

The temporal width and fluence of the processed pulse may also be chosen to match the thickness and properties of the first layer materials so that the surface temperature at the first layer (i.e. the surface exposed to radiation) does not exceed a predetermined maximum temperature. Using a suitable processed pulse width on a 1 $\mu$m layer, it is possible to keep the surface temperature below the perovskite melting temperature of approximately 1500° C. (depending on the material used).

Of course, it will be readily appreciated that instead of commencing with a short pulse having a first temporal duration, and extending the pulse, a longer initial pulse could be employed by using a bespoke laser device. However, this would prove more costly and so is not preferred. We may wish to seek protection for such a method in which a non-extended pulse is used.

In a refinement, the first layer may be illuminated with the processed pulse whilst the ambient temperature of the device is maintained higher than room temperature. An ambient temperature in the range 100° C.–450° C., or 200° C.–450°

C., or any other range between the limits 100° C. and 500° C. approximately could be used. An ambient temperature of 300° C. is preferred. This means that it is possible to use a lower energy laser pulse source it has less work to do to raise the temperatures above the phase transition temperature. In a further refinement, the laser light could illuminate the substrate during deposition of the first layer.

It will also be appreciated that there may be a considerable time delay between depositing the layer (or layers) forming the device and the annealing steps. For instance, the device layers may be deposited in one factory or room within a factory before moving to another room or factory to be annealed. Indeed, the method may find application in annealing any device having first and second layers at any time in its life or before or after use.

The first layer of material may be deposited at a temperature below that needed to form perovskite and may be deposited substantially wholly as non-perovskite phase. For instance, for PST a non-perovskite layer would be produced by depositing at below 300° C. (to produce an amorphous material) or between 300° C. or at 500° C. to produce a pyrochlore material. The higher the temperature used to deposit, the more likely that some of the material will exist in the perovskite phase before annealing. Of course, the temperature used to deposit the material must not exceed the temperature budget of the second layer.

By temperature budget, the skilled man will of course appreciate that we mean the maximum temperature that the second layer can be heated to without causing unacceptable damage or degradation to the second layer.

In accordance with a second aspect, the invention provides an apparatus for producing an integrated ferroelectric device, said device comprising at least a first layer of material capable of existing in a perovskite phase and second layer of material defining an integrated circuit, the apparatus comprising:

pulse generating means adapted to generate a pulse of energy having a first temporal width;

pulse extending means adapted to extend the temporal pulse width of said pulse to provide a processed pulse of greater temporal width;

and guide means adapted to guide said processed pulse of energy onto said first layer whereby some or all of the material in the first layer is converted from a non-ferroelectric state into a ferroelectric state or to otherwise improve the quality of the material of the first layer without exceeding the temperature budget of the integrated circuit of said second layer.

The apparatus may further comprise depositing means for depositing said first layer of material above said second layer in which some or all of said first layer is in a non-perovskite phase.

The pulse generating means may, for example, comprise a laser such as an excimer laser, such as a krypton fluoride (KrF) laser. Alternatively, it may comprise a carbon dioxide ($CO_2$) laser. The laser may have a wavelength in the ultra-violet spectrum, for instance 248 nm. An example of a suitable laser is the Lambda Physik LPX210i Krf excimer laser.

The depositing means may be adapted to deposit a first layer of material above the second layer after one or more intermediate layers are deposited onto the second layer. One of these intermediate layers may comprise a sacrificial layer that is subsequently removed to leave a space between the first and second layers to form a microbridge. By providing electrical contacts between the integrated circuitry of the second layer and the first layer the device may act as an infrared thermal detector.

Removal means may therefore be provided for removing the sacrificial layer. The layer be removed before or after the first layer is annealed.

The device may comprise a thermal detector such as a pyroelectric or dielectric botometer type infrared detector. This may comprise an array of device defining a thermal imaging camera, perhaps an uncooled array. Alternatively, it may comprise a piezoelectric actuator or perhaps a ferro-electric random access memory. A number of devices may be provided in an array on a single wafer. Of course, in a modification it will be within the scope of protection sought to provide an apparatus for annealing any device which includes a first layer that is to be annealed (perhaps not ferroelectric) and a second layer which is sensitive to overheating.

Where an array of devices are provided, the processed pulse may illuminate more than one or preferably all of the devices in the array simultaneously. Alternatively, the processed pulse may be applied sequentially to the devices by scanning a laser beam made up of a number of processed pulses across the array of devices. In another arrangement, the laser may be fixed whilst the array of devices moves relative to the laser using one or more translation stages.

The apparatus may further include means for raising the ambient temperature of the integrated device during annealing. This may comprise a heating element upon which the device is placed.

The apparatus may further comprise means for evacuating the air from around the device during annealing. For example, a vacuum chamber may be provided with the device being placed in the vacuum chamber. An inlet port may be provided whereby the chamber can be filled with one or more gases, such as oxygen, during the annealing.

The pulse extender may be adapted to increase the temporal pulse width of the first pulse by substantially two times or four times, or substantially ten times or more than ten times or any value therebetween. In one arrangement, the pulse extender may be adapted to produce a processed pulse that comprises a number of sub-pulses, each sub pulse corresponding to the first pulse. This may be achieved using partial multiple reflections of the first pulse. A suitable pulse extender can be obtained from Exitech Limited, Hanborough Park, Long Hanborough, Oxford, OX8 8LH.

In accordance with a third aspect, the invention provides an integrated ferroelectric device comprising at least a first layer of ferroelectric material and a second layer comprising an integrated circuit, in which said first layer is transformed into a perovskite phase using a pulse of energy from a laser that has been temporally extended.

The first layer may comprise a material selected from the class of material which can exist in a perovskite phase, such as PST, lead zirconate titanate (PZT), barium strontium titanate (BST), lead titanate (PT) and others.

The second layer may comprise silicon, silicon oxide and the requisite metallisation and implant doping layers to define the integrated circuit. Of course, other materials are possible.

The device may comprise a microbridge. This may form a part of an imaging device to detect incident radiation. An array of devices may be provided, for example to produce a two-dimensional image of a scene. In this case, the first layer may be spaced from the second layer to define a bridge overlapping the second layer.

The upper surface of the bridge may have a metal coating. The lower surface of the bridge may have a metal coating as well as or instead of the upper layer. The metal coating on the lower surface of the bridge may comprise a platinum layer overlapping a titanium layer. The metal coating on the upper surface may comprise a titanium layer.

The integrated circuit of the second layer may comprise a read out integrated circuit (ROIC). It may include an amplifier adapted to amplify signals from the first layer.

A barrier layer, such as silicon dioxide may be provided on the lower surface of the bridge. This may overlap any metallic layer that is present. The second layer may also be provided with a barrier layer. Again, this may be silicon dioxide for example. The barrier layers prevent sacrificial material which defines the gap between the first and second layers from reacting with the layers during manufacture of the device. Of course, in the finished device, substantially all of the sacrificial material may well have been removed using a suitable etch. A thermal barrier layer, e.g. a layer of $SiO_2$ having a low thermal diffusivity may be provided below the first layer in the gap to improve the downward flow of heat away from the first layer.

Of course, the device does not need to comprise a microbridge. It may, for example, comprise an alternate form of infrared sensing device. It may be a thin film piezoelectric actuator or a ferroelectric random access memory (FeRAM) or a dynamic random access memory (DRAM).

Most preferably the thickness of the first layer of ferroelectric material is greater than 2000 Å, or greater than 5000 Å, or up to 1 µm. Substantially all of the material throughout the thickness of the layer may exist in the perovskite phase which is annealed using the extended laser pulse.

In accordance with yet a further aspect, the invention provides a method of preferentially heating a first layer of material to a first temperature without heating a second layer of a material provided below said first layer to said first temperature by illuminating the first layer with a temporally extended pulse of radiation from a laser source.

By temporally extending a pulse, the surface temperature of the first layer when illuminated with sufficient pulse energy to heat the whole layer up to or above the first temperature is lower than for a corresponding un-extended pulse where the energy is supplied in a shorter period of time.

Of course, in an alternative the first layer may be heated to such an extent that the uppermost surface layer exceeds its melting point or is otherwise damaged. After annealing, this damaged (unwanted) layer could be milled away or otherwise removed.

The first layer may comprise a material which is capable of existing in a ferroelectric state. The second layer may comprise a silicon base upon which an integrated circuit is formed. It is generally accepted that such circuits will be damaged if heated in excess of 450° C., whilst most ferroelectric materials need to be heated in excess of 450° C. to produce a high grade ferroelectric material. This can be achieved using the method of the present invention for layers of ferroelectric material up to at least 1 µm in thickness.

Preferably, the pulse width is selected so that it is sufficiently long to ensure that the heat at the surface of the first layer diffuses away at a rate that keeps the surface temperature below melting, yet sufficiently long that the surface temperature of the second layer does not exceed the first temperature. This will depend on the properties of the first layer and the wavelength of the pulse.

In accordance with a still further aspect, the invention provides a method of heat treating a treatment layer of an article comprising said treatment layer and one or more further layers, the method comprising the steps of illuminating the article with a laser pulse which is temporally extended by a temporal extender, the temporal width and fluence of the pulse being selected so that the treatment layer is raised to a treatment temperature T whilst one or more of the further layers are kept substantially below the treatment temperature T.

Preferably the treatment layer extends from a surface of the article downwards with one or more further layers below the treatment layer.

Alternatively, the treatment layer may be provided between one or more other layers.

The laser pulse may be temporally extended by partial reflection of a laser beam.

The heat treatment may comprise an annealing process. This may be adapted to convert the state of some or all of the material of the treated layer from its untreated state to a different treated state. An example is conversion of a ferroelectric material from a non-perovskite to a perovskite state, or from low grade perovskite to higher grade perovskite. Other treatments include heating to relieve locked in stresses within the first layer, or simply, to cause chemical change in the material of the layer or some other physical change of state.

In accordance with a still further aspect, the invention provides apparatus adapted to heat treat a treatment layer of an article comprising a treatment layer and one or more further layers, comprising a laser adapted to produce a laser pulse, a temporal extender adapted to extend the temporal width of the laser pulse, and means for guiding the temporally extended pulse onto the article, whereby the laser pulse is adapted to raise the temperature of that treatment layer above a treatment temperature T whilst one or more of the further layers are kept substantially below the treatment temperature.

Looked at one way, an object of the invention in at least one arrangement is to provide a more uniform heating of the material in the first layer than can be achieved using standard commercially available laser devices. Alternatively, it may be considered as a technique and apparatus for reducing the surface temperature at the first layer by providing the required heat energy at a slower rate using an extended pulse. In another aspect, the invention ensures that heat is kept away from unwanted areas of the article by providing a suitable duration extended pulse which provides more controlled and accurate heating of the layer of material.

There will now be described, by way of example only, one embodiment of the present invention with reference to the accompanying drawings of which:

In order to quantify the improvements that are attainable using a method and apparatus in accordance with the present invention a model of the temperature profiles throughout a typical infra-red sensing device was developed and experimental data was obtained using both a prior art single pulse laser and a pulse-extended laser in accordance with the invention.

The diffusion equation for heating of an arbitrary material using laser radiation has been solved. Assuming the layer stack and the irradiating laser beam to be uniform in the x-y plane, the later due to the use of a beam homogeniser, then the equation can be expressed in a uni-dimensional form as:

$$\frac{\partial T}{\partial t} = \frac{\alpha}{\rho c_p} I(z,t) + \sigma \varepsilon (T^4 - T_a^4) + \frac{1}{\rho c_p} \frac{\partial}{\partial z}\left(k \frac{\partial T}{\partial z}\right)$$

where I (z, t) is the power density of the laser light at a depth z and at a time t, T is the temperature in the absorbing medium, $T_a$ is the ambient temperature of the annealing chamber and ε, ρ, Cp, k and α are the emissivity, density, specific heat, thermal conductivity and absorption coefficient respectively. By inputting the thermal properties of a ferroelectric material such as PST and the temporal form of the laser pulse applied to the material, the temperature distribution throughout the material can be estimated. It should, however, be noted that the effect of latent heat due to the formation of the perovskite phase was not taken into account, but this does not effect the invention.

Figure 1:
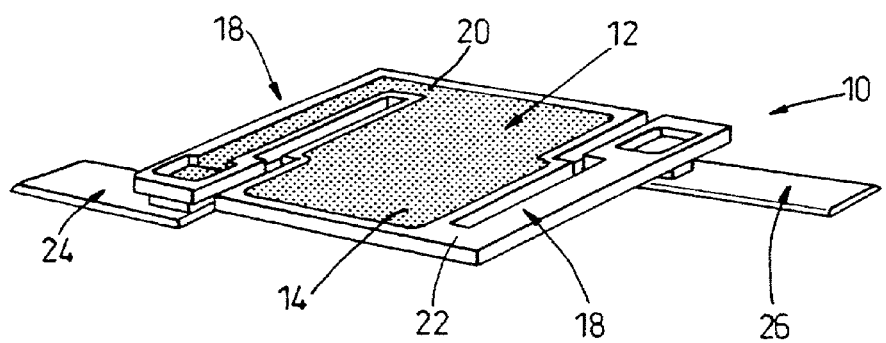
FIG. 1 is a representation of an integrated uncooled IR detector having a ferroelectric layer that is annealed in accordance with the present invention.
Figure 10:
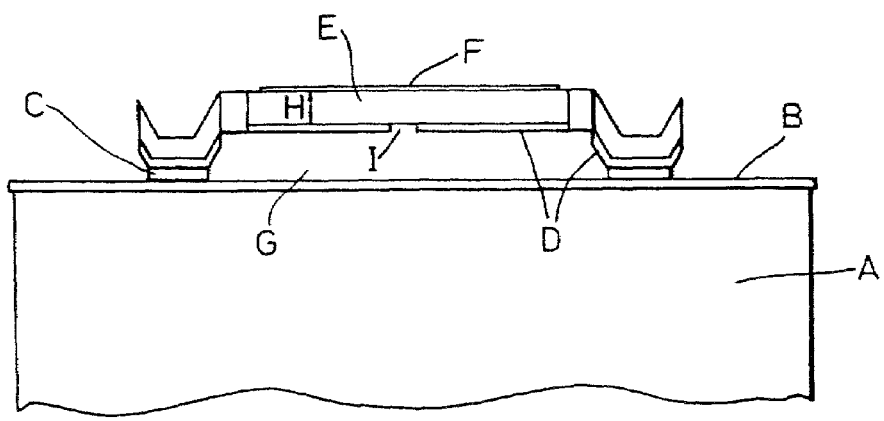
FIG. 10 is a cross-section illustrating a typical microbridge device annealed in accordance with the invention.

The structure of a typical sensor is shown in cross section in FIG. 10 and in plan in FIG. 1 of the accompanying drawings (and in Table 1 on page 3).

The sensor comprises a microbridge 10 as shown in FIG. 1 which has a main detector area 12 which forms a single pixel in an array of pixels in an imaging device. The main detector area 12 comprises a bridge 14 of sensing material that is responsive to incident radiation, typically a ferroelectric material such as Lead Scandium Tantalate. The microbridge area is typically 50 microns by 50 microns. The leg width is around 5 microns, and the length of the leg around 30 microns. The sensing sensing material is provided with electrically conducting coatings on both the lower and upper faces. The coating on the upper face is patterned to be only on the upper bridge body area. The coating on the lower face is patterned in the same shape as the sensing material, and thus is continuous down the microbridge legs. An electrical discontinuity (not shown) in the lower coating separates the bridge 14 into two areas. A substrate or base layer (not shown) of silicon is provided, and the bridge 14 is supported away from the silicon base layer by a pair of legs 18 which slope down to contact the main detector area 12 at diagonally-opposed corners 20 and 22. Feet 24 and 26 of the legs contact the silicon base layer.

Figure 2:
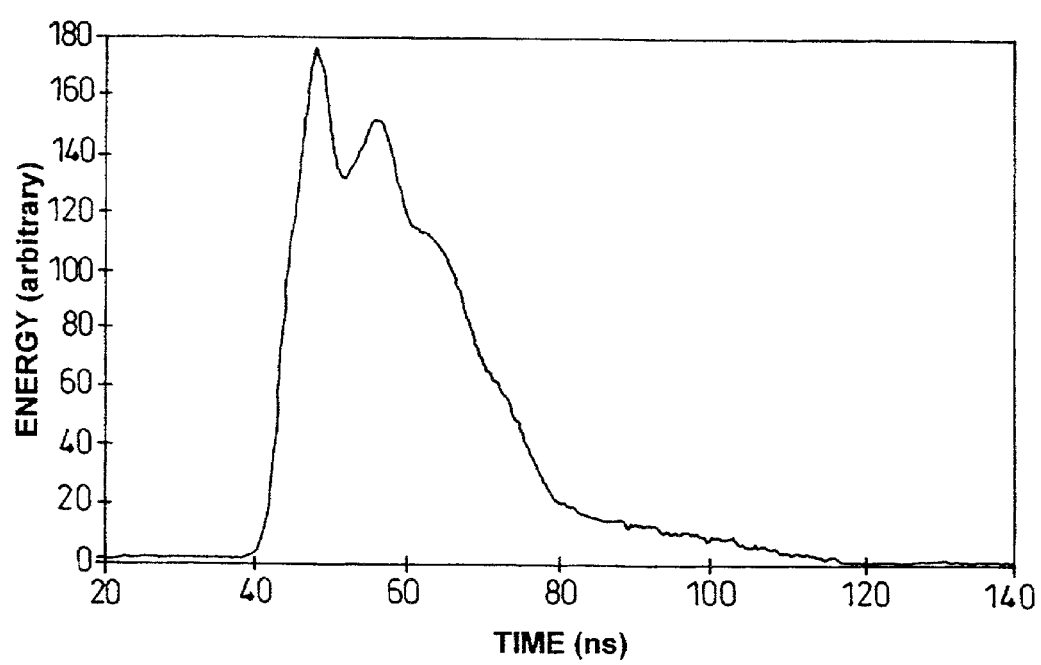
FIG. 2 is a plot of the measured temporal pulse shape for a prior art Lambda Physik LPX210i excimer laser.

FIG. 10 shows a cross-section view of the microbridge in FIG. 2 taken so as to pass through the two feet of the microbridge (not to scale). In the arrangement of FIG. 10, there is a silicon base layer or substrate A which has a depth of, typically, 300 to 500 microns, a silicon dioxide insulating layer B extending above the silicon layer with a depth of about 0.5 microns, a space G (filled with sacrificial material during the manufacture of the device) with an average depth of 1 to 2 microns, a titanium layer and a platinum layer D (titanium of the order of 100 Å, platinum layer of the order of 1,000 Å), a ferroelectric layer E, in this example of Lead Scandium Tantalate having a depth/thickness of about 1 micron, and a titanium layer F having a depth of about 100 to 200 Å.

The upper and lower surfaces of the ferroelectric material have metallic coatings. The metal coating on the lower surface comprises a platinum layer overlaying in titanium layer. The metal coating on the upper surface comprises a titanium layer. The distance between the conducting layers D and F of FIG. 2, referenced H, when combined with the refractive index of the sensing material, results in an optical path equal to one quarter of the wavelength of the radiation to which the microbridge is to be sensitive. Thus, the microbridge is tuned for absorption to a particular wavelength by the thickness of the thermally sensitive layer. For 10 micron wavelength radiation this translates to around 1 micron physical thickness for most ferroelectric ceramic materials, and preferably for lead scandium tantalate. For optimum absorption, the titanium coating on the upper surface has a sheet resistance matched to free-space i.e. 377 ohms per square, and the platinum coating on the lower surface has a high infra-red reflectance i.e. is over 100 nanometers thickness. The lower coating has a discontinuity, I, (to give, effectively, two parallel-plate capacitor plates connected back-to-back in series). This allows the lower coating to be used to give two contacts to the sensing material and allows the upper coating to be electrically floating.

Conductive metal interconnect tracks, C, are provided on the silicon base layer, to connect the signals from the microbridge to the read-out electrodes. The silicon base layer is coated with an insulating layer, B, in this case silicon dioxide, to electrically insulate the interconnect tracks. The two halves of the lower coating on the sensing material are connected each to a separate interconnected track on the silicon base layer. In an imaging device where readout electronics are in the base silicon layer, then the interconnect tracks will be patterned with the read-out electronics i.e. under the silicon dioxide or other similar passivation layer, B, and the contacts to the microbridge will be through a via in the passivation layer.

Figure 3:
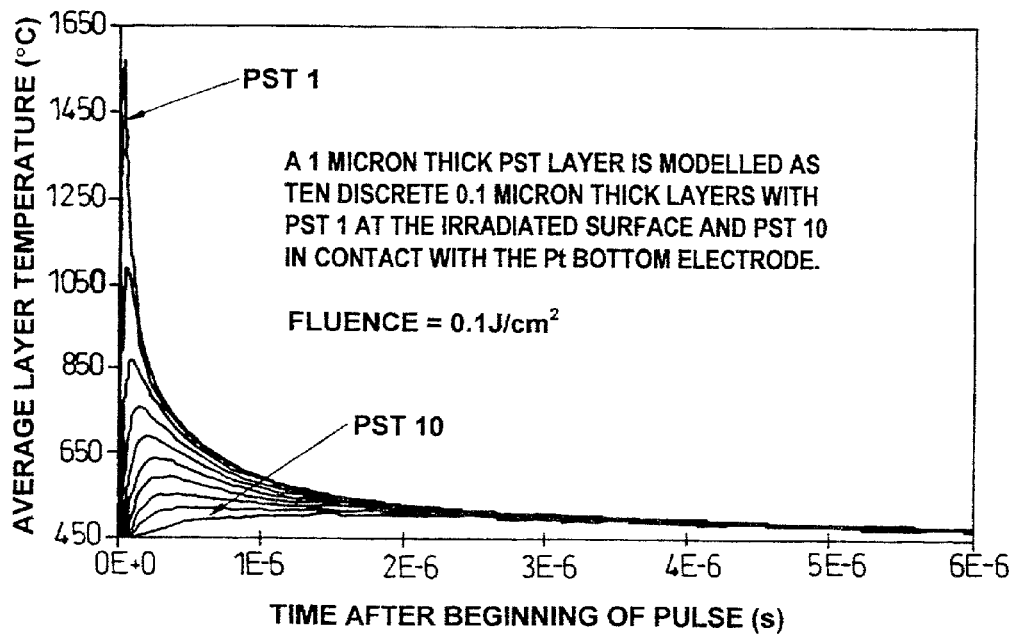
FIG. 3 illustrates a set of predicted prior art temperature profiles through 1 micron of PST due to exposure to a non-extended laser pulse of width 25 nm and a fluence of 0.1 $J/cm^2$.
Figure 4:
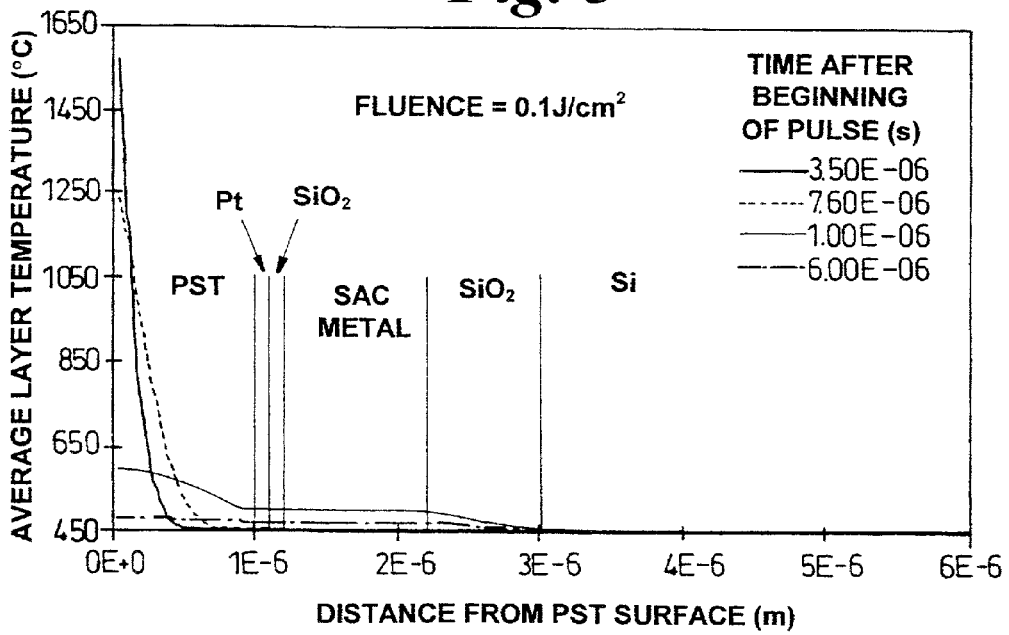
FIG. 4 illustrates the predicted prior art temperature profiles through the depth of the PST layer stack during and after exposure to a non-extended laser pulse with fluence 0.1 $J/cm^2$.

Shown in FIGS. 3 and 4 are the temperature distributions throughout the layers of the device of FIG. 10 due to a 25 cm wide laser pulse from an excimer laser with a fluence of 0.1 j/cm$^2$. The temperature distribution was modelled in simulation by ten discrete 0.1 μm thick layers, the mean temperatures of which are shown as a function of depth in FIG. 4. The surface temperature is very high as well as the temperature gradient through the PST layer. FIG. 4 shows the temperature distribution with distance from the irradiated surface. Again, high temperature gradients and excessive surface heating are apparent.

Figure 11:
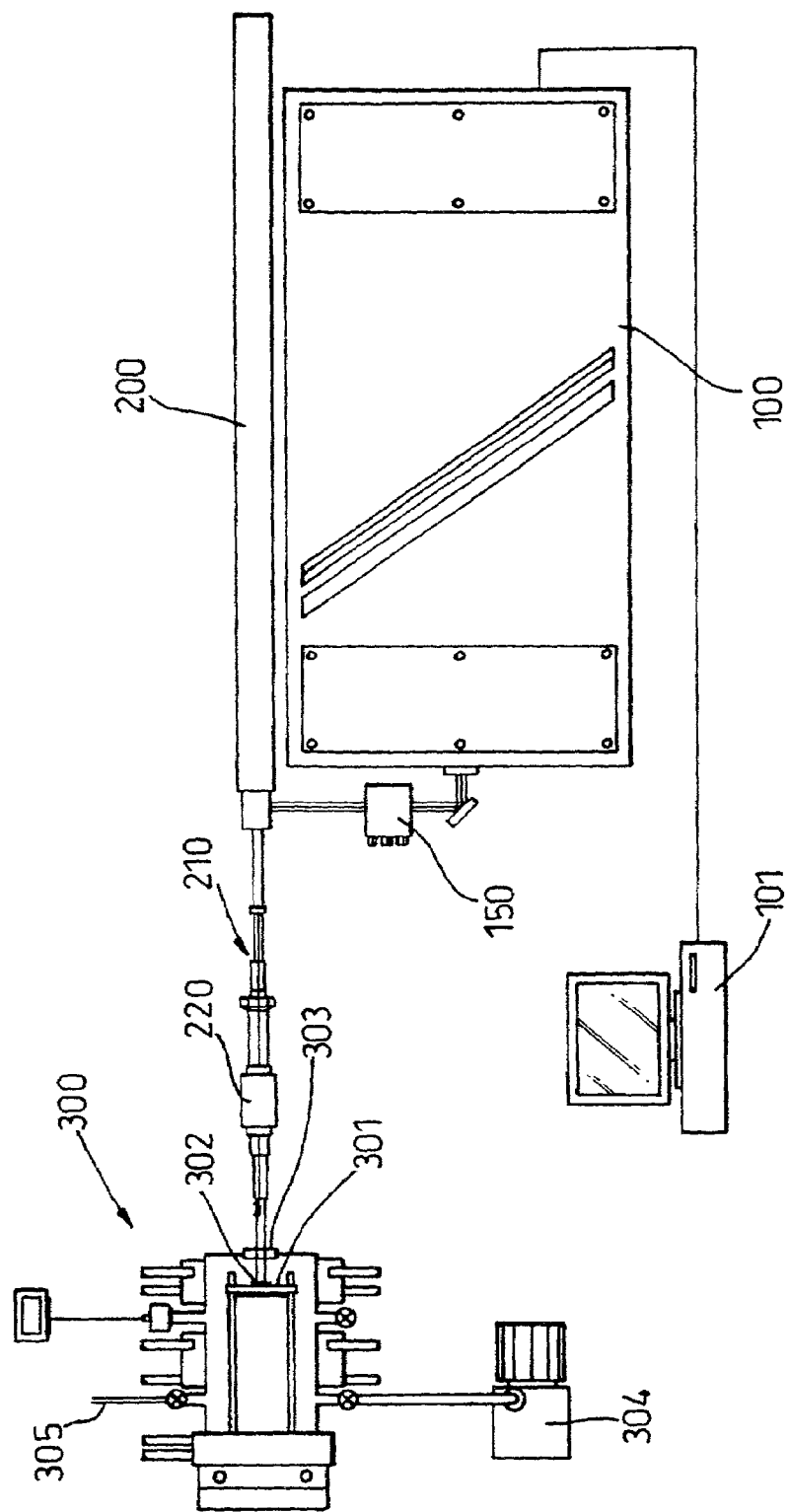
FIG. 11 illustrates an apparatus of one embodiment of the invention.

In order to solve the problem of the high surface temperature, an apparatus in accordance with an aspect of the invention has been proposed. This is illustrated in FIG. 11. It comprises a commercial excimer laser 100 controlled by a computer 101 which produces a light pulse with a pulse duration at full width at half maximum (fwhm) of 25 ns. The output of the laser 100 is passed through a variable attenuator 150 and a temporal extender 200 which effectively increases the pulse duration and hence the diffusion length. The extended laser pulse is then passed through an anamorphic telescope 210 and a beam homogeniser 220 to a vacuum chamber 300.

The vacuum chamber 300 incorporates a heating plate 301 upon which a wafer 302 containing an unprocessed sensor is placed behind a UV transparent window 303. The heat raises the ambient temperature of the wafer defining the sensor, and the pulsed laser beam anneals the PST layer into a layer in the perovskite phase. A vacuum pump 304 is provided for evacuating the chamber whilst an inlet 305 allows a process gas to be introduced to the chamber.

Figure 5:
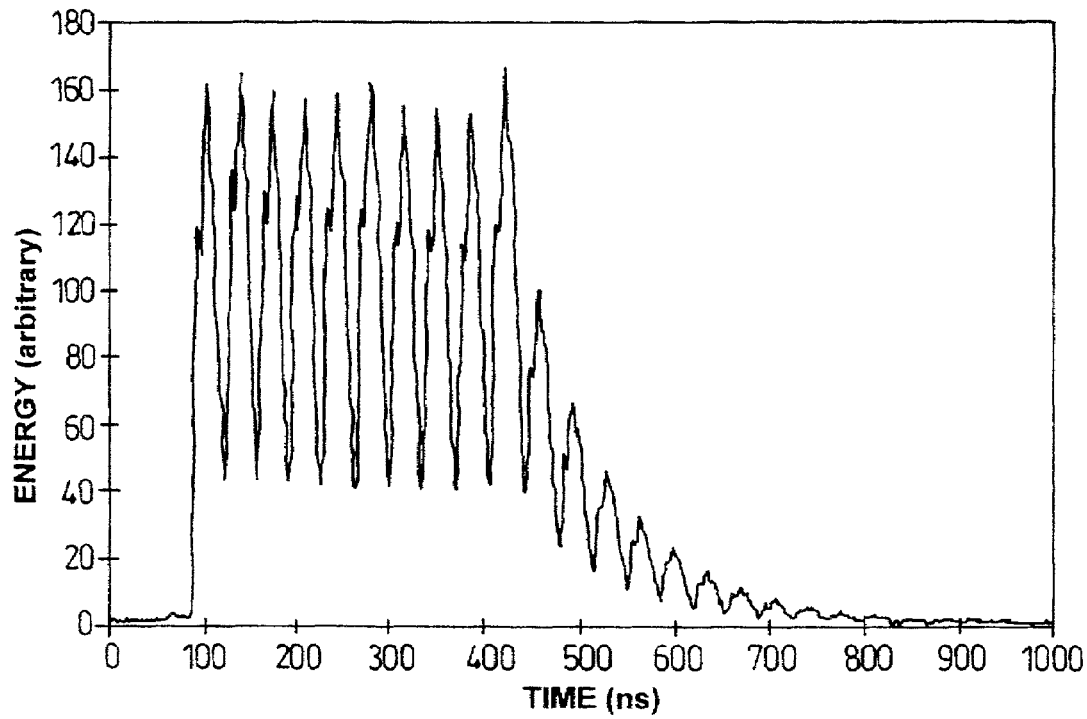
FIG. 5 illustrates the measured temporal pulse shape for a x 10 pulse-extension action with a 35 ns interpulse delay using an excimer laser as in accordance with the present invention.

A measured temporal profile from the apparatus is shown in FIG. 5. Ten sub-pulses can be seen corresponding to the main pulse extension action and then decaying subsidiary pulses which correspond to imperfections in the system. The pulse extender has increased the pulse duration from a full width at half maximum of 25 ns to one of 350 ns.

Figure 6:
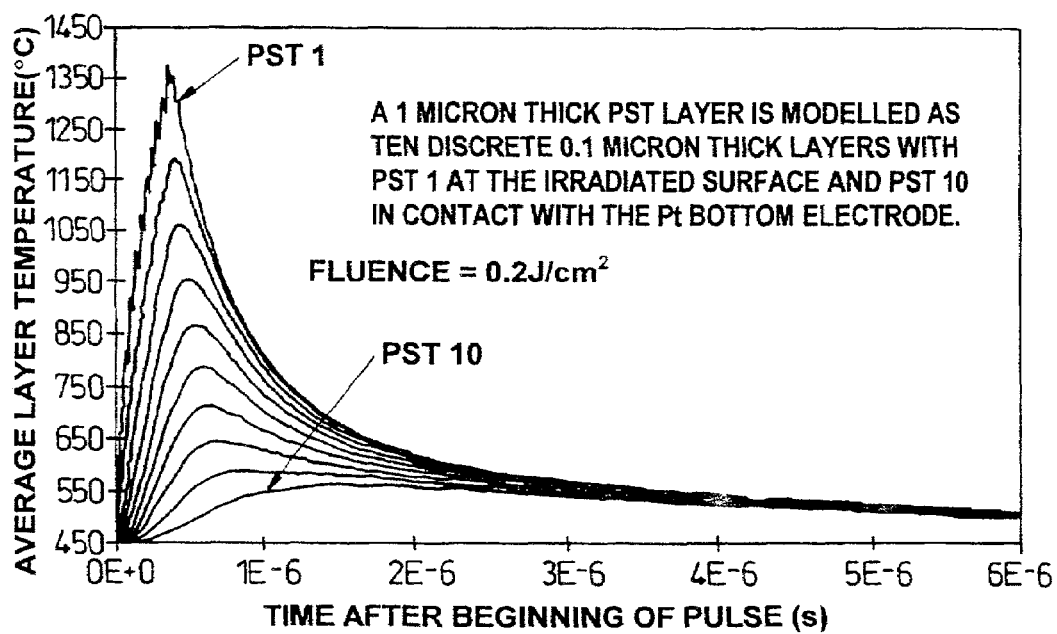
FIG. 6 shows predicted temperature profiles for a 1 micron layer of PST when exposed to an extended laser pulse with fluence 0.2 J/cm$^2$.
Figure 7:
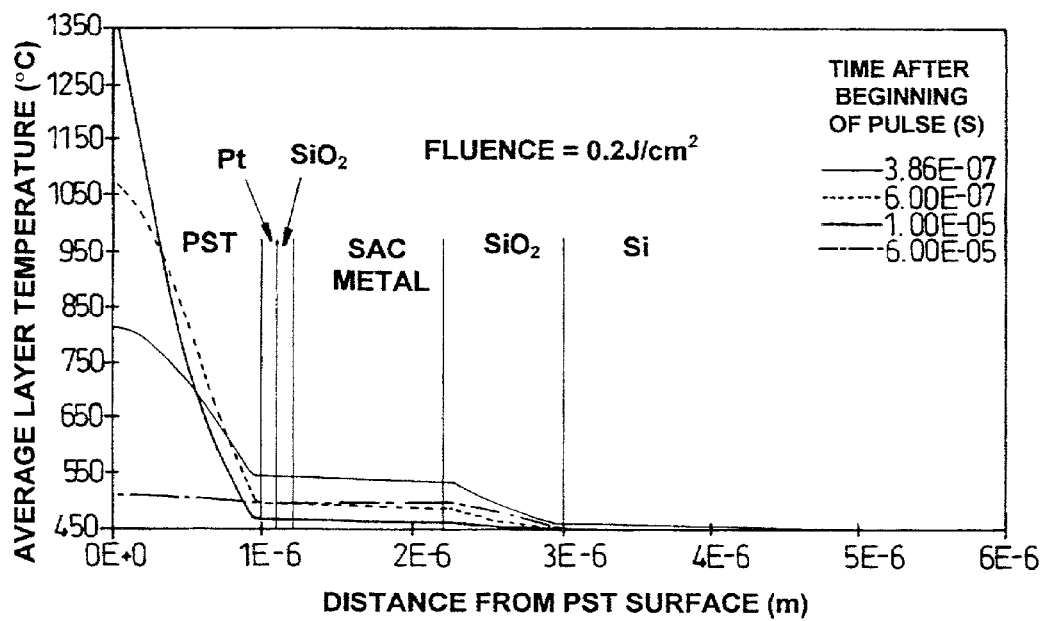
FIG. 7 shows predicted temperature profiles through the depth of the PST layer stack during and after exposure to an extended laser pulse with fluence 0.2 J/cm$^2$.

Assuming the pulse to have a fluence of 0.1 J/cm$^2$ (as for the unextended pulse) the effect of the pulse on the layers is shown in FIG. 6 for the mean layer temperatures and in FIG. 7 for the temperature distribution with distance from the irradiated surface at various times. Again, a 1 $\mu$m layer of PST modelled as ten 0.1 $\mu$m layers was assumed.

The effect of the pulse extender is to effectively slow down the rate of energy delivered to the surface thereby giving the heat generated more time to diffuse away. The surface temperatures are correspondingly lower than for the non-extended pulse with lower thermal gradients, and hence an average higher temperatures, within the whole of the PST layer. Clearly, the pulse length is still sufficiently short to prevent the temperature of the topmost surface of the silicon water—where the active circuitry resides—from rising more than a few degrees above the ambient temperature of the wafer as a whole.

Initial studies using apparatus based on the arrangement shown in FIG. 11 with sol-gel deposited PZT have shown that the technique is capable of crystallising amorphous as-deposited material into the required ferroelectric perovskite phase without damaging the underlying ROIC.

Figure 8:
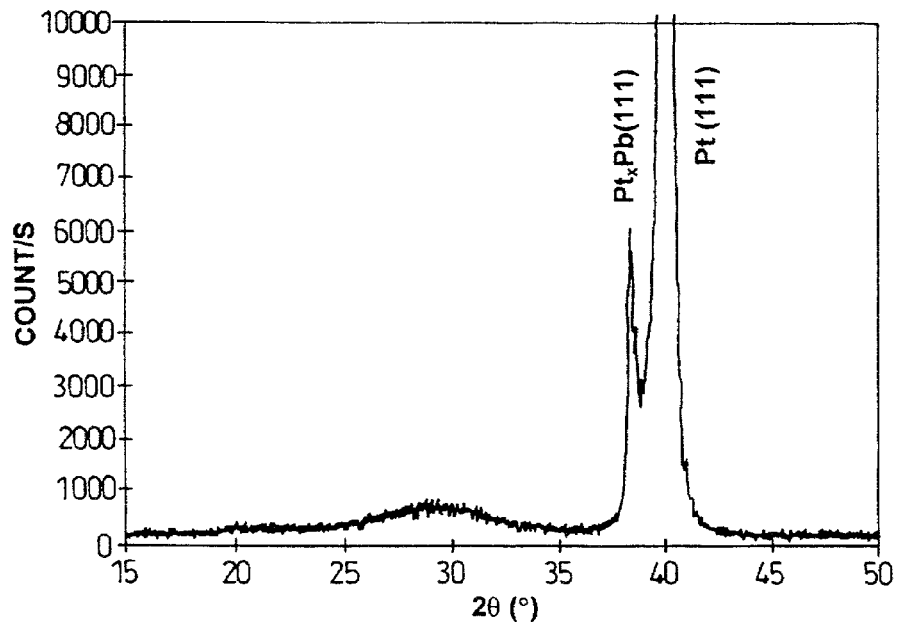
FIG. 8 is an XRD θ-2θ scan of as deposited, unannealed, layer of sol-gel PZT.

FIG. 8 shows an x-ray diffraction (XRD) θ-2θ scan of the material as deposited. The reflections present which are visible in the Figure are due to the platinum underlining the PZT and an intermetalic which forms due to a reaction between the platinum in the substrate and the lead in the as-deposited PZT.

Figure 9:
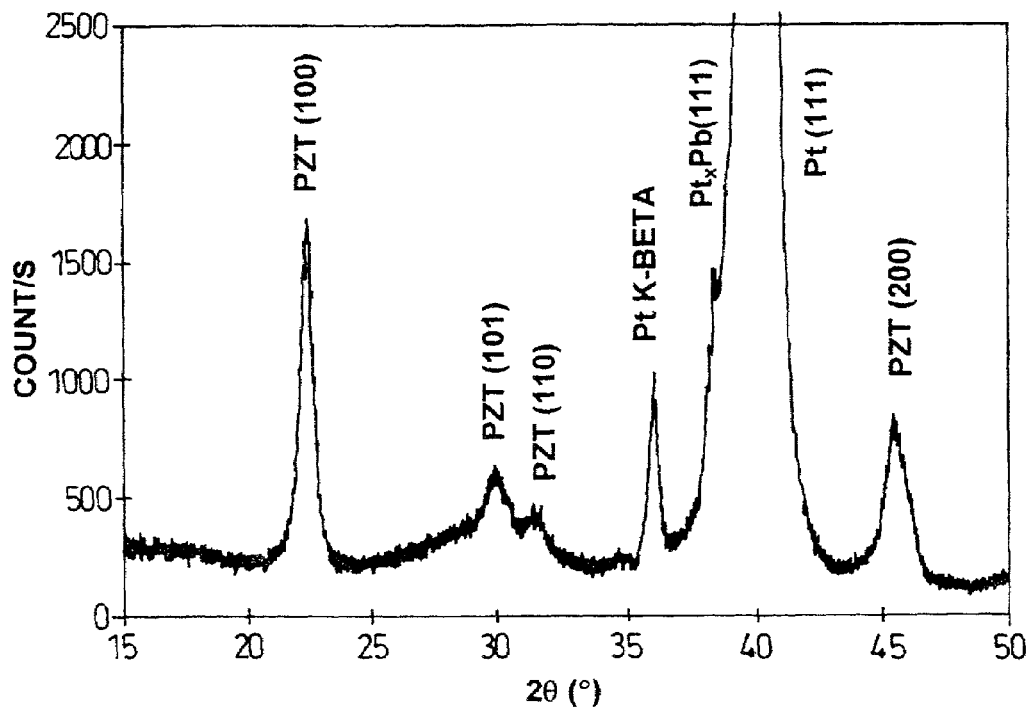
FIG. 9 is an XRD θ-2θ scan of pulse-extended laser annealed sol-gel PZT.

FIG. 9 shows a similar XRD θ-2θ scan of the pulse-extended excimer laser annealed material with 10$^4$ pulses at a fluence of 80 mJ/cm$^2$ with the substrate heated to an ambient temperature at 300° C. in an oxygen filled chamber. Reflections from perovskite PZT can be clearly observed showing that the material has been crystallised into the correct phase.

What is claimed is:

1. A method of producing an integrated ferroelectric device comprising a first layer of material capable of existing in a ferroelectric state and a second layer of material defining an integrated circuit, said method comprising the steps of:
   producing a pulse of energy having a first temporal width;
   extending said first temporal width of said pulse by passing said pulse through a temporal extender to produce a processed pulse having a greater temporal width than said first temporal width; and
   illuminating said first layer with said processed pulse to convert some or all of said material in said first layer from a non-ferroelectric state into a phase capable of exhibiting ferroelectricity or otherwise improving the quality of said material of said first layer without exceeding the temperature budget of said integrated circuit of said second layer.

2. A method to according claim 1 wherein said method further comprises generating more than one of said processed pulses and sequentially illuminating said first layer with said processed pulses.

3. A method according to claim 1 wherein said material of said first layer comprises a low grade deposited perovskite and said method improves the quality of said perovskite material.

4. A method according to claim 1 wherein said first layer includes material deposited in a non-perovskite phase and said method converts some or all of the material into said perovskite phase.

5. A method according to claim 1 wherein said pulse of energy comprises a pulse of energy produced using a laser.

6. A method according to claim 5 wherein said pulse produced by said laser has a temporal length between 10 ns and 25 ns.

7. A method according to claim 1 wherein said temporal extender increases the temporal length of said pulse to produce a processed pulse with a temporal length of approximately 300 ns, or between substantially 300 ns and 400 ns, or longer.

8. A method according to claim 1 wherein said processed pulse comprises more than one sub-pulse, each of said sub-pulses corresponding to a pulse action of said extender.

9. A method according to claim 1 wherein said processed pulse has a fluence and temporal width that is compatible with properties of said material of said first layer such that the temperature throughout said layer (or over a substantial depth of said first layer) exceeds a predetermined anneal temperature whilst the temperature of said second layer is within said temperature budget of said circuitry.

10. A method according to claim 1 wherein said first layer comprises a top layer of said device.

11. A method according to claim 1 wherein two different sources of energy are produced, each source producing a respective pulse and at least one of said respective pulses being extended by a pulse extender to produce a processed pulse, and wherein said first layer is illuminated by both pulses.

12. A method according to claim 11 wherein said layer is illuminated by both pulses substantially simultaneously.

13. A method according to claim 11 which further comprises providing a metallic layer between said first layer and said second layer and illuminating said first layer with the two different processed pulses.

14. A method according to claim 1 wherein said first layer is illuminated with said processed pulse whilst said ambient temperature of said device is maintained higher than room temperature.

15. An apparatus for producing an integrated ferroelectric device from an initially non-ferroelectric device, said initially non-ferroelectric device comprising at least a first layer of non-perovskite phase material having a thickness greater than 2000 Å and second layer of material defining an integrated circuit, said apparatus comprising:

pulse generating means for generating a pulse of energy having a first temporal width;

pulse extending means for extending said first temporal pulse width of said pulse to provide a processed pulse of greater temporal width;

and guide means for guiding said processed pulse of energy onto said first layer, said pulse generating means and said pulse extending means providing sufficient energy to anneal at least a portion of said non-perovskite phase material into perovskite phase material.

16. Apparatus according to claim 15 which further comprises depositing means for depositing said first layer of material above said second layer in which some or all of said first layer is in a non-perovskite phase.

17. Apparatus according to claim 16 wherein said depositing means is adapted to deposit a first layer of material above said second layer after one or more intermediate layers are deposited onto said second layer.

18. Apparatus according to claim 17 wherein one of said intermediate layers comprises a sacrificial layer.

19. Apparatus according to claim 15 wherein said pulse generating means comprises a laser.

20. Apparatus according to claim 19 wherein said laser has a wavelength in the ultraviolet spectrum.

21. Apparatus according to claim 15 wherein said pulse extender is adapted to increase said temporal pulse width of said first pulse by substantially at least two times.

22. Apparatus according to claim 15 wherein said pulse extender is adapted to produce a processed pulse that comprises a plurality of sub-pulses.

23. An apparatus for producing an integrated ferroelectric device, said device comprising at least a first layer of material capable of existing in a perovskite phase and second layer of material defining an integrated circuit, said apparatus comprising:

pulse generating means for generating a pulse of energy having a first temporal width;

pulse extending means for extending said first temporal pulse width of said pulse to provide a processed pulse of greater temporal width;

and guide means for guiding said processed pulse of energy onto said first layer; and depositing means for depositing said first layer of material above said second layer in which some or all of said first layer is in a non-perovskite phase.

* * * * *